(12) United States Patent
Jang et al.

(10) Patent No.: US 8,316,531 B2
(45) Date of Patent: Nov. 27, 2012

(54) SEMICONDUCTOR DEVICE FABRICATION PROCESS

(75) Inventors: Ho-Soo Jang, Busan (KR); Dong-Soo Lee, Cheonan-si (KR); Dong-Chul Han, Cheonan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 489 days.

(21) Appl. No.: 12/615,000

(22) Filed: Nov. 9, 2009

(65) Prior Publication Data

US 2010/0119350 A1 May 13, 2010

(30) Foreign Application Priority Data

Nov. 13, 2008 (KR) .................. 10-2008-0112634

(51) Int. Cl.
*B23P 19/00* (2006.01)
(52) U.S. Cl. ............... 29/739; 29/734; 29/740; 29/741; 29/760; 29/832
(58) Field of Classification Search .......... 29/739, 29/740, 760, 734, 832, 852, 720, 741; 414/751.1, 414/752, 753, 941, 744.8, 800; 294/64.1; 408/91, 88, 87, 107, 110, 114
See application file for complete search history.

(56) References Cited

U.S. PATENT DOCUMENTS

| | | | | |
|---|---|---|---|---|
| 6,185,815 | B1* | 2/2001 | Schindler | 29/740 |
| 7,020,954 | B2* | 4/2006 | Hartmann et al. | 29/760 |
| 7,146,718 | B2* | 12/2006 | Thuerlemann | 29/741 |
| 2005/0011067 | A1* | 1/2005 | Thuerlemann | 29/739 |

FOREIGN PATENT DOCUMENTS

| | | |
|---|---|---|
| JP | 11-340696 | 12/1999 |
| JP | 2001-144498 | 5/2001 |
| JP | 2007-180184 | 7/2007 |
| KR | 1020030042196 | 5/2003 |
| KR | 1020030085342 | 11/2003 |
| KR | 1020040091222 | 10/2004 |
| KR | 1020060120980 | 11/2006 |
| KR | 1020070066285 | 6/2007 |
| KR | 1020070082781 | 8/2007 |

OTHER PUBLICATIONS

The Korean Intellectual Property Office (KR), Publication Date Nov. 28, 2006 (machine tranlation), Application No. 10-2006-0120980A, Inventor Byeong Gwan Moon.*

* cited by examiner

*Primary Examiner* — Derris H Banks
*Assistant Examiner* — Tai Nguyen
(74) *Attorney, Agent, or Firm* — F. Chau & Associates, LLC

(57) ABSTRACT

A clamping apparatus capable of clamping various semiconductor substrates is provided. The clamping apparatus includes includes a main body, and a support plate partially coupled to the main body. The support plate is movable vertically. In addition, the clamping apparatus further includes a fixed gripper coupled and fixed onto the main body and a movable gripper disposed on the main body. The movable gripper is movable horizontally.

18 Claims, 8 Drawing Sheets

US 8,316,531 B2

SEMICONDUCTOR DEVICE FABRICATION PROCESS

CROSS-REFERENCE TO RELATED APPLICATION

This application claims priority to Korean Patent Application No. 10-2008-0112634, filed on Nov. 13, 2008, the disclosure of which is hereby incorporated by reference herein in it's entirety.

BACKGROUND

1. Technical Field

Example embodiments relate to a clamping apparatus used to clamp a semiconductor substrate in a semiconductor device fabrication process.

2. Description of Related Art

Various types of semiconductor substrates are used in semiconductor device fabrication processes. Also, semiconductor substrates are gradually getting thinner and broader. However, such thin and broad semiconductor substrates may be readily bent during processing.

Thus, there is a need in the art for apparatuses for use in semiconductor device fabrication processes which may prevent or lessen semiconductor substrates from being bent and/or warped during the semiconductor device fabrication processes.

SUMMARY

Example embodiments may provide a clamp which can be used on various kinds of substrates in semiconductor device fabrication processes and a clamping apparatus including the same.

Example embodiments may also provide a semiconductor device fabrication process using a clamping apparatus including a clamp which can be used on various kinds of substrates.

The inventive concept provides more than what is mentioned above, as will be understood by those skilled in the art from the description below.

In accordance with an example embodiment of the inventive concept, a clamping apparatus is provided. The clamping apparatus includes a main body, and a support plate partially coupled to the main body. The support plate is movable vertically. In addition, the clamping apparatus further includes a fixed gripper coupled and fixed onto the main body and a movable gripper disposed on the main body. The movable gripper is movable horizontally.

In accordance with another example embodiment of the inventive concept, a semiconductor device fabrication process using a clamping apparatus which includes a main body, a support plate partially coupled to the main body and wherein the support plate is movable vertically, a fixed gripper coupled and fixed onto the main body, and a movable gripper disposed on the main body and wherein the movable gripper is movable horizontally is provided. The process includes: picking up a semiconductor substrate, moving the semiconductor substrate to the clamping apparatus using a pick-up arm, raising the support plate above the main body, placing the semiconductor substrate down on the support plate using the pick-up arm, lowering the support plate, moving the movable gripper horizontally to clamp the semiconductor substrate on the support plate and raising the pick-up arm.

Details of other example embodiments are described in the detailed description and illustrated in the drawings.

BRIEF DESCRIPTION OF THE DRAWINGS

Example embodiments can be understood in more detail from the following description taken in conjunction with the accompanying drawings, in which.

DETAILED DESCRIPTION OF EXAMPLE EMBODIMENTS

Figure 1A:
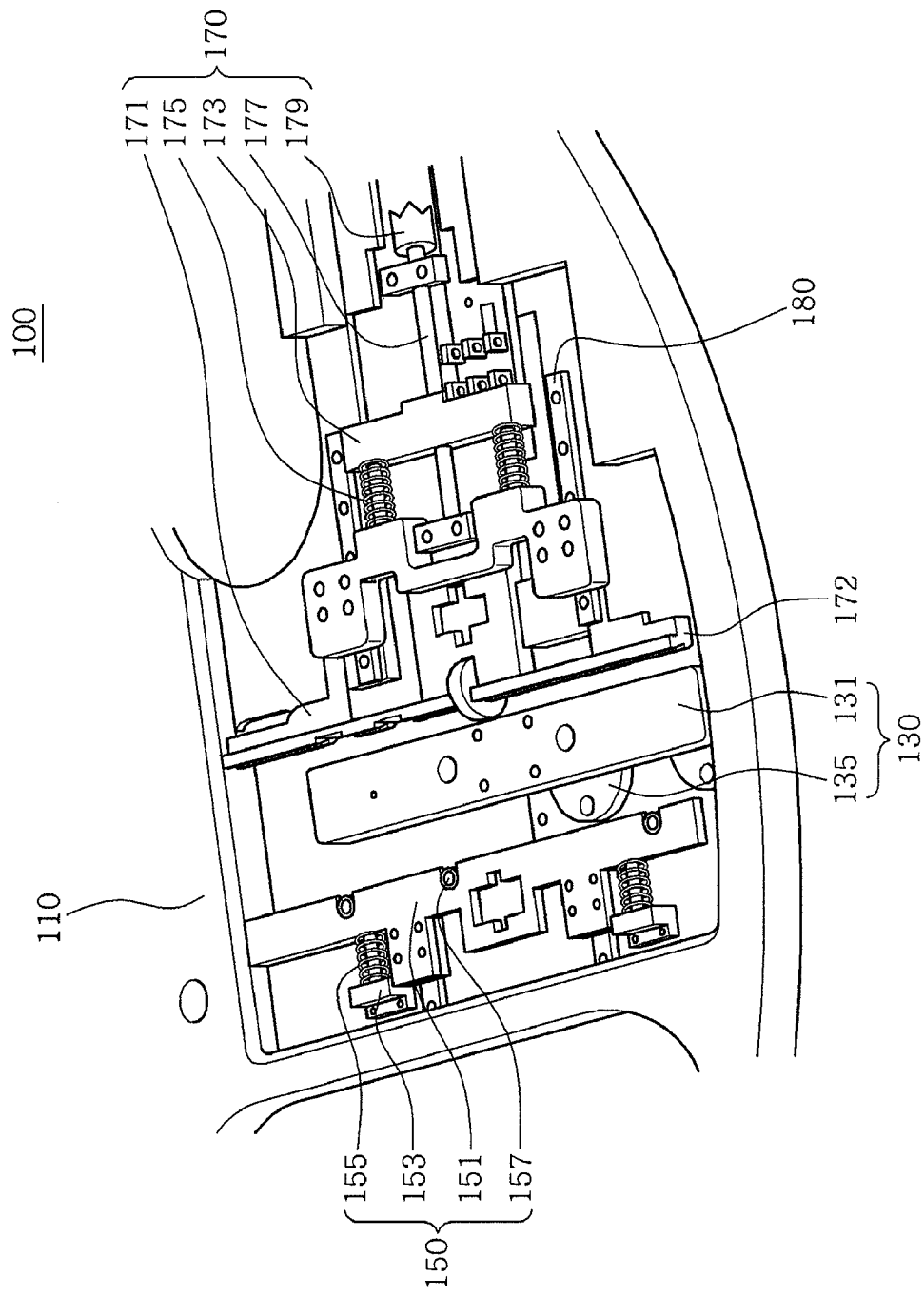
FIGS. 1A and 1B are a schematic perspective view and plan view of a semiconductor substrate clamping apparatus including a clamp according to an example embodiment, respectively.

Example embodiments will be described in detail below with reference to the accompanying drawings. It will be apparent to those skilled in the art that various modifications can be made without departing from the spirit and scope of the inventive concept. Whenever the same element appears in different drawings, it is denoted by the same reference numeral.

Example embodiments are described herein with reference to schematic plan and cross-sectional views. As such, variations from the exact shapes of the illustrations as a result, for example, of manufacturing techniques and/or tolerances, may be expected. Thus, example embodiments should not be construed as limited to the particular shapes of regions illustrated herein but may include deviations in shape that result from fabrication processes. Thus, the schematic figures which do not necessarily illustrate the actual shape of a region should not be construed as limiting the scope of the inventive concept.

Figure 1B:
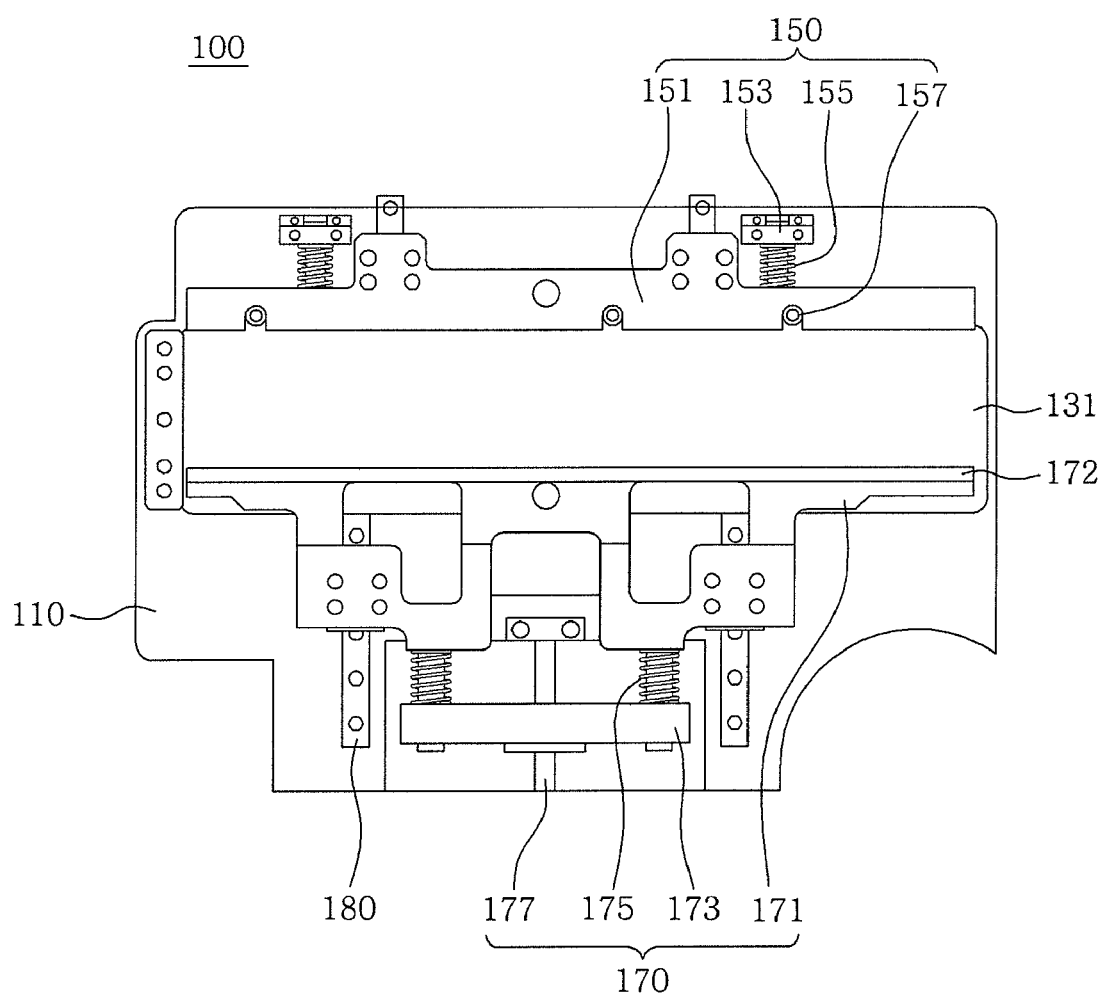

FIGS. 1A and 1B are a schematic perspective view and plan view of a semiconductor substrate clamping apparatus according to an example embodiment, respectively. Referring to FIGS. 1A and 1B, the semiconductor substrate clamping apparatus includes a clamp 100. The clamp 100 includes a main body 110, a support plate 130, a fixed gripper 150, and a movable gripper 170. The clamps 100 illustrated in FIGS. 1A and 1B may not be the same.

The main body 110 may include a plurality of support plates 130, fixed grippers 150 and movable grippers 170. The support plate 130, the fixed gripper 150 and the movable gripper 170 may be coupled to and/or installed at the main body 110, and may constitute a unit clamp 100. The main body 110 is movable forward/backward, or to the left and right. For example, the clamp 100 for supporting a semiconductor substrate may move forward/backward, or to the left and right. The movement of the clamp 100 may move due to movement of the main body 110. In other words, a part of the clamp 100 may be fixed to the main body 110. In addition, the main body 110 may be, for example, disk-shaped. This means that a designated number of semiconductor substrates may be accommodated on the main body 110, and the main body 110 may rotate about its center axis. While rotating, a designated number, e.g., one set, of semiconductor substrates is placed on the main body 110, and then an operation step for a process may be conducted. After finishing the operation of the process, the semiconductor wafers on the main body 110 may be replaced and another operation may be conducted. One set is not limited to a particular number of semiconductor substrates but rather may be understood as being whatever number of semiconductor substrates may be input at the same time in one process. When the main body 110 is not disk-shaped, it may be difficult for a designated number of semiconductor substrates to go through the same process in limited space. In the main body 110, a space through which the support plate 130 can pass may be fainted. This can be better understood by describing the support plate 130 in further detail below.

The support plate 130 may support a semiconductor substrate from below. The support plate 130 may include a first plate unit 131 and a vertical driving unit. The first plate unit 131 may be an upper part of the support plate 130 and may have, for example, a plane shape. The first plate unit 131 may be moved vertically upward and downward by the vertical driving unit. For example, when a semiconductor substrate to be clamped by the clamp 100 is transferred, the support plate 130 may move to a higher level than the grippers 150 and 170 so that the semiconductor substrate may be placed on the support plate 130. After this, the support plate 130 may move to the level of the grippers 150 and 170 so that the grippers 150 and 170 may grip the semiconductor substrate. An upper surface of the support plate 130 may move down to a lower level than the main body 110 or move up to a higher level than the grippers 150 and 170. The first plate unit 131 may have, for example, a flat bar or rectangular shape. The support plate 130 may be fixed to the main body 110 by a first fixing unit 135. Also, the support plate 130 may include a first buffering unit. The first buffering unit may prevent a collision between the support plate 130 and the main body 110 and a sudden stoppage of operation at a stop point when the support plate 130 moves down. The first buffering unit may be disposed near the first fixing unit 135. Specific structures of the first fixing unit 135 and the first buffering unit may be readily understood from the detailed description of the example embodiments.

A first buffering member may be disposed on the first plate unit 131 of the support plate 130. The first buffering member may be, for example, metal, glass, ceramic, a carbon compound, etc. Because the clamp 100 can decrease a force being applied to the semiconductor substrate and protect the semiconductor substrate from gravity, the support plate 130 can prevent or lessen distortion of the semiconductor substrate by physical and/or chemical forces. For example, bending and/or warping of the semiconductor substrate may be prevented or lessened.

The fixed gripper 150 may include a second plate unit 151, a second fixing unit 153, and a second buffering unit 155. The second plate unit 151 may have, for example, a plane shape and be disposed at a contact point with the main body 110 or at a part contacting a semiconductor wafer. The second plate unit 151 of the fixed gripper 150 may also have, for example, a bar shape. The fixed gripper 150 may be, for example, flat at a part disposed on the main body 110 and a part contacting a semiconductor wafer. In other words, the second plate unit 151 may include two flat parts. The fixed gripper 150 may be fixed to the main body 110 by the second fixing unit 151. The second buffering unit 155 may be disposed between the second plate unit 151 and the second fixing unit 153. And, the second plate unit 151 may further include second buffering members 157 at a part contacting the semiconductor substrate. The second buffering members 157 may comprise, for example, rubber. The second fixing unit 153 and the second buffering unit 155 may be disposed at two or more points, and the second buffering members 157 may be disposed at three or more points.

The movable gripper 170 may include a third plate unit 171, a third fixing unit 173, a third buffering unit 175, and a forward/backward driving unit 179. The third plate unit 171 may be, for example, flat and disposed at a part contacting the semiconductor substrate, or may have, for example, a bar shape and/or a plane shape. The third fixing unit 173 may be fixed to a driving shaft 177. The driving shaft 177 is connected to the forward/backward driving unit 179 to transfer a force which moves the movable gripper 170 forward/backward. The third buffering unit 175 may be disposed between the third plate unit 171 and a part which fixes the forward/backward driving unit 179. The third buffering unit 175 may absorb shocks due to physical collisions between the third plate unit 171 and the part which fixes the forward/backward driving unit 179. The third plate unit 171 may further include a substrate supporting unit 172. The substrate supporting unit 172 may have, for example, a recessed shape or a stepped shape, and stably support the semiconductor substrate in one longitudinal direction. In other words, the substrate supporting unit 172 may be formed in lines extending along the third plate unit 171. The forward/backward driving unit 179 may transfer a rotational force from a driving motor to the driving shaft 177, which then may move the movable gripper 170 forward and backward. In other words, spiral-shaped grooves are formed in the movable gripper 170 so that it can move forward and backward according to rotation of the driving shaft 177. The third fixing unit 173 and the third buffering unit 175 may be disposed at two or more places of the movable gripper 170. The movable gripper 170 may further include a third buffering member. The third buffering member may be disposed at a recessed region and/or a position which contacts the semiconductor substrate on the third plate unit 171 or the substrate supporting unit 172. The third buffering member may be made of at least one of the materials which constitutes the first and second buffering members.

A rail 180 may be disposed between the main body 110 and the movable gripper 170 and/or fixed onto the main body 110. The movable gripper 170 may move forward and backward on the rail 180. For example, a slider, and/or a bearing may be provided between the movable gripper 170 and the rail 180. In the example embodiment, each of the buffering units 155 and 175 may include, for example, a spring.

Figure 2A:
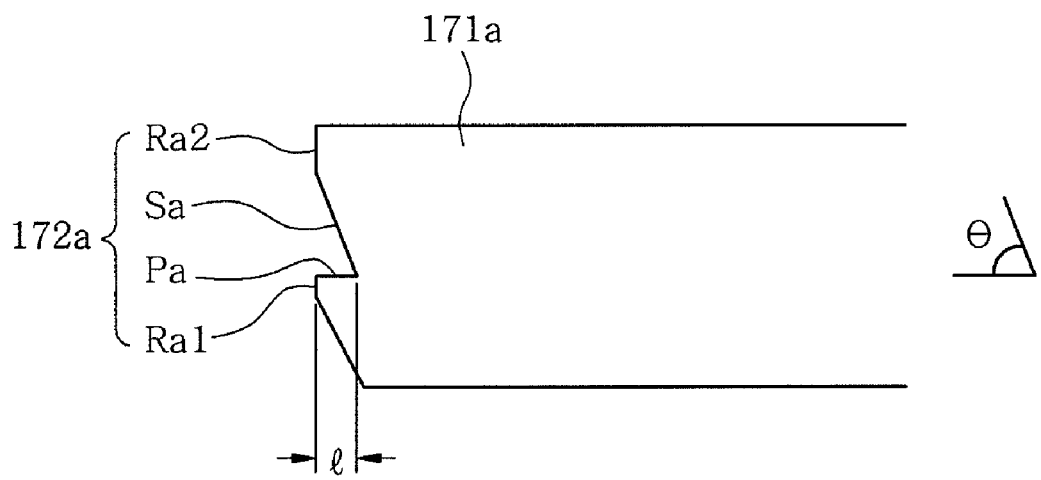
FIGS. 2A and 2B are cross-sectional views of a substrate supporting unit formed in a third plate unit according to an example embodiment.
Figure 2B:
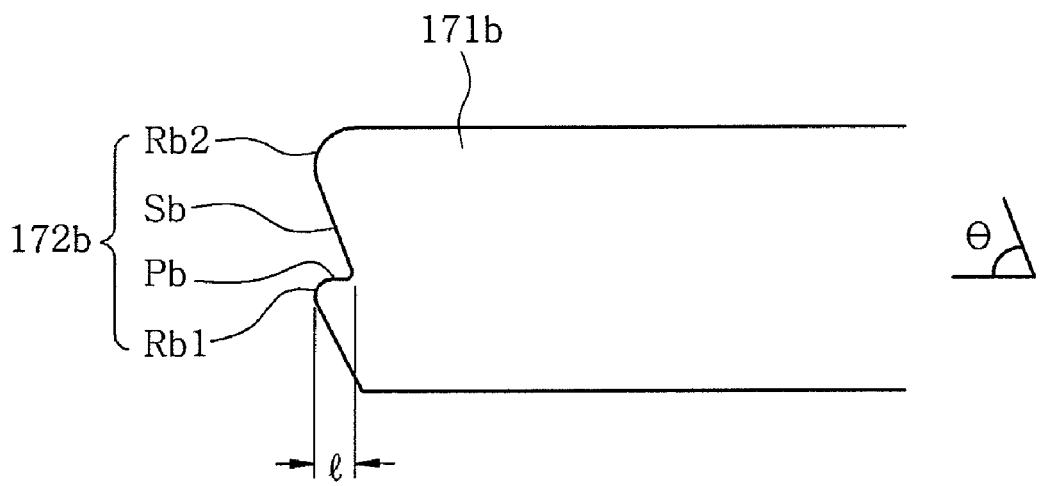

FIGS. 2A and 2B are cross-sectional views of a substrate supporting unit formed on a third plate unit according to example embodiments. Referring to FIG. 2A, a third plate unit 171a includes a substrate supporting unit 172a. The substrate supporting unit 172a may include, for example, a flat base surface Pa and an oblique side surface Sa.

The stepped shape may be formed in various different ways and shapes. In the present example embodiment, angles of recess ($\theta$), depths of recess (l) and shapes of recess are schematically illustrated. In various experiments, when the recess angle ($\theta$) is between about 60 degrees and about 80 degrees, it was possible to make a compromise between operation and durability of the apparatus. In experiments up to now, the most appropriate angle was about 70 degrees.

In experiments, the recess depth (l) was not seen to make much difference. However, when the recess depth (l) was formed too deep, deterioration of uniformity during operation was expected. Therefore, in general, it is beneficial to form the depth to be within several millimeters. In this experiment, the depth was formed to be about one millimeter.

The recess shape may be formed by, for example, the flat base surface Pa and oblique side surfaces Ra1 and Ra2, and corners of the third plate unit 171*a* may be manufactured not to be sharp. It will be understood from the drawings that each corner is manufactured not to be sharp.

Referring to FIG. 2B, an edge of a flat base surface Pb of a substrate supporting unit 171*b* may be manufactured as round shapes Rb1 and Rb2 to distribute force and reduce physical shock which can be applied to a semiconductor substrate.

Next, a series of semiconductor device fabrication processes using a semiconductor substrate clamping apparatus including a clamp according to an example embodiment will be described with reference to the accompanying drawings. To particularly describe example embodiments, a process of marking a semiconductor substrate will be described as an example.

Figure 3A:
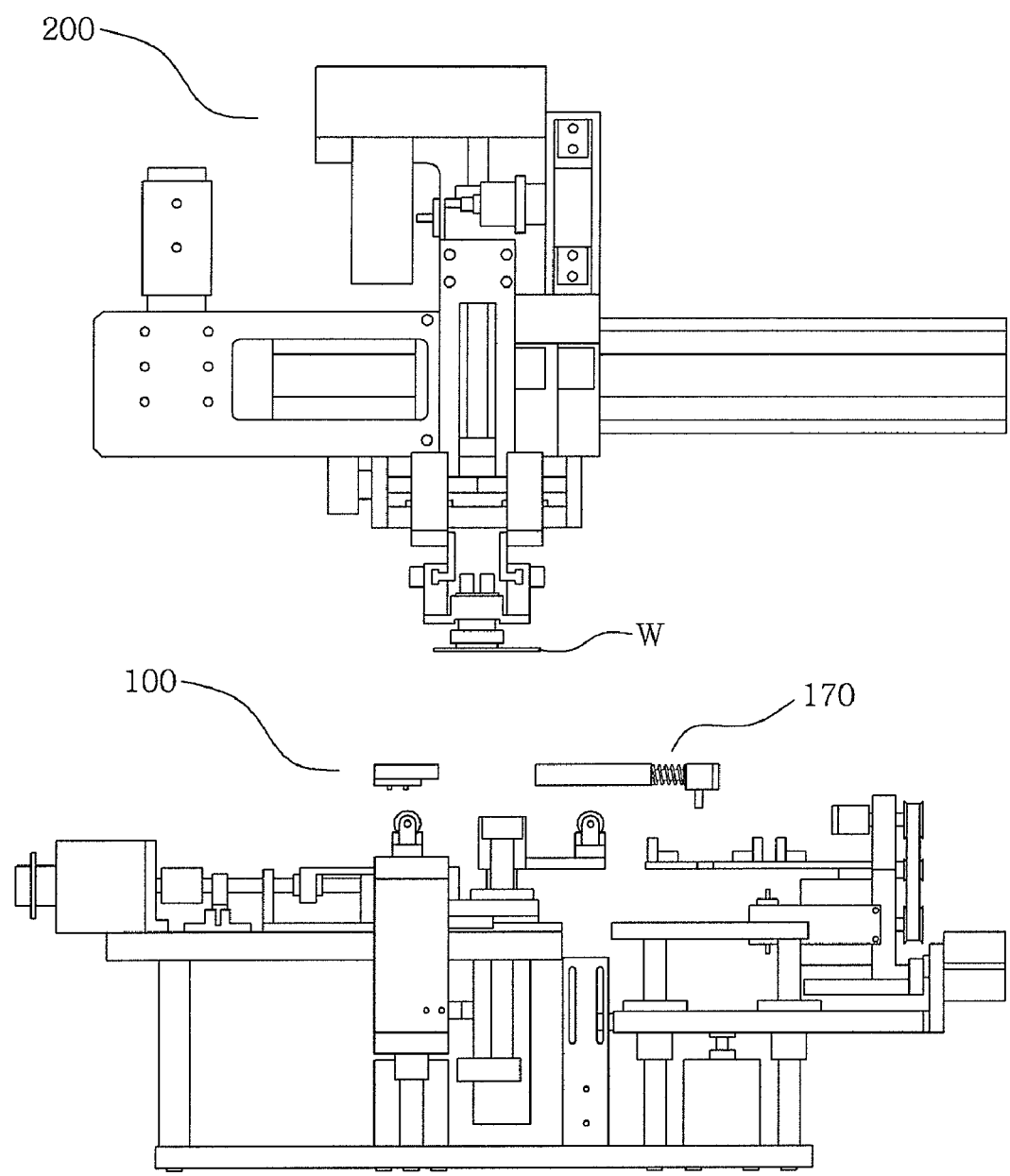
FIGS. 3A through 3E are schematic diagrams illustrating operations of a process of marking a semiconductor substrate using a semiconductor substrate clamping apparatus including a clamp according to an example embodiment.

FIGS. 3A through 3E are schematic diagrams illustrating operations in a process of marking a semiconductor substrate using a semiconductor substrate clamping apparatus including a clamp according to an example embodiment. Referring to FIG. 3A, a pick-up arm 200 picks up a semiconductor substrate W and moves the semiconductor substrate W above a clamp 100. Here, the clamp 100 is in a lowered state.

Figure 3B:
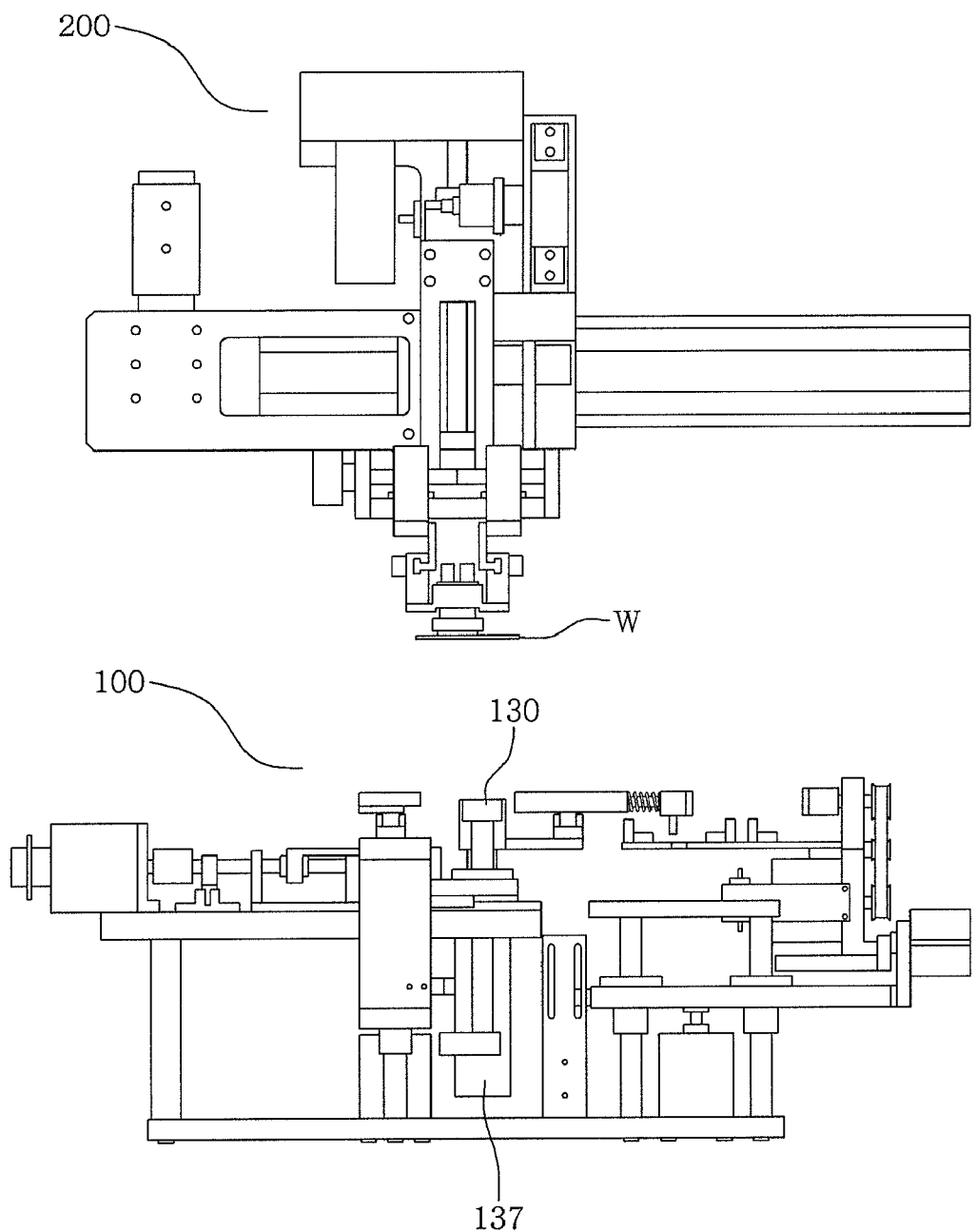

Referring to FIG. 3B, in a state in which the movable gripper 170 of the clamp 100 has moved backward and the clamp 100 is open, the support plate 130 rises. The movable gripper 170 moves forward or backward by rotation or reverse rotation of a driving shaft to open the clamp 100. In a subsequent or simultaneous operation, the support plate 130 may rise by force of the vertical driving unit 137, and according to circumstances, it may rise above the grippers 150 and 170.

Figure 3C:
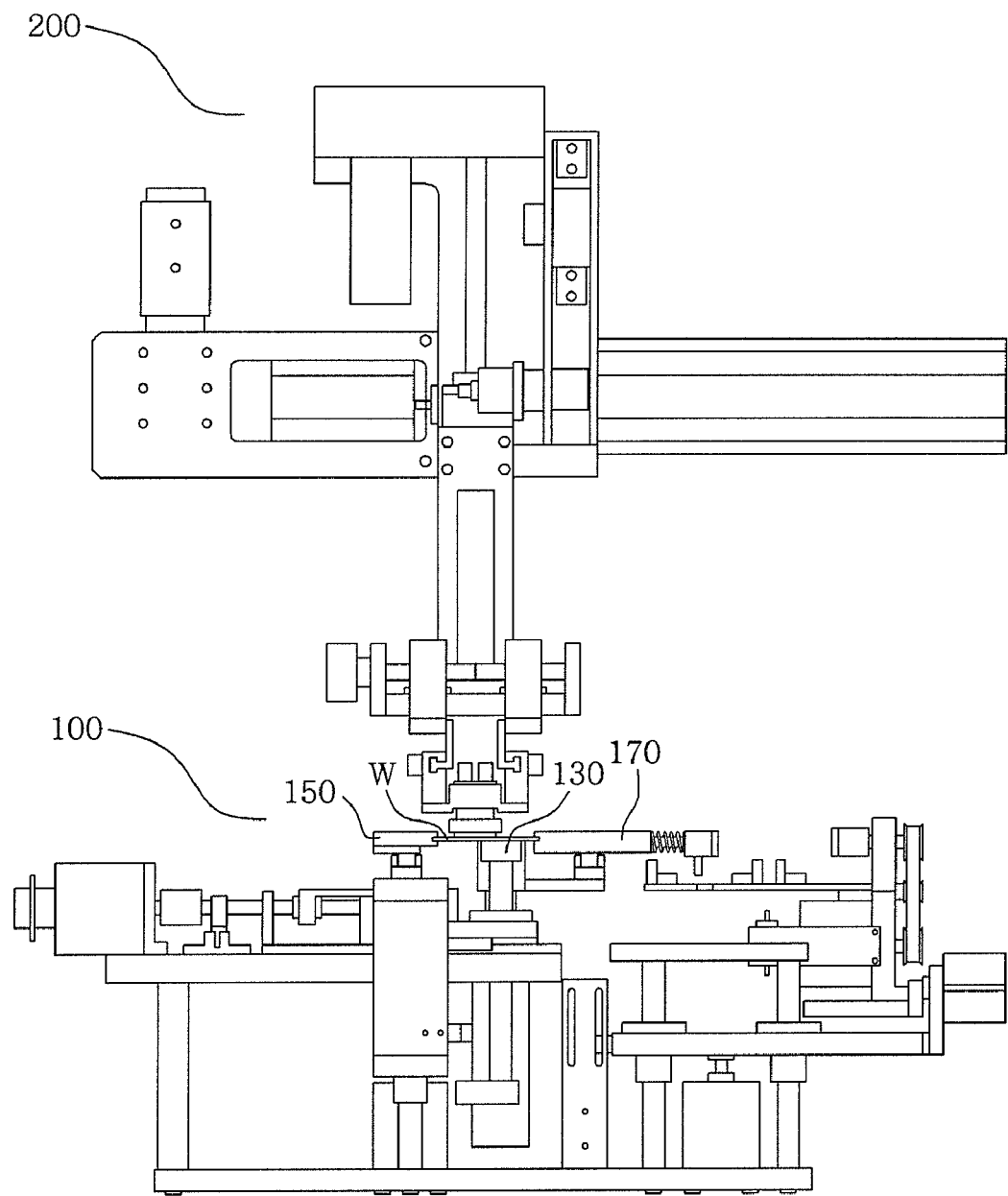

Referring to FIG. 3C, the pick-up arm 200 moves down and lays down the semiconductor substrate on the support plate 130. Next, the pick-up arm 200 releases and the grippers 150 and 170 grip the semiconductor substrate W. In other words, the clamp 100 is closed. Here, because the support plate 130 may absorb pressures caused by the pick-up arm 200 pressing the semiconductor substrate W, bending and warping of the semiconductor substrate W may be prevented or lessened.

Figure 3D:
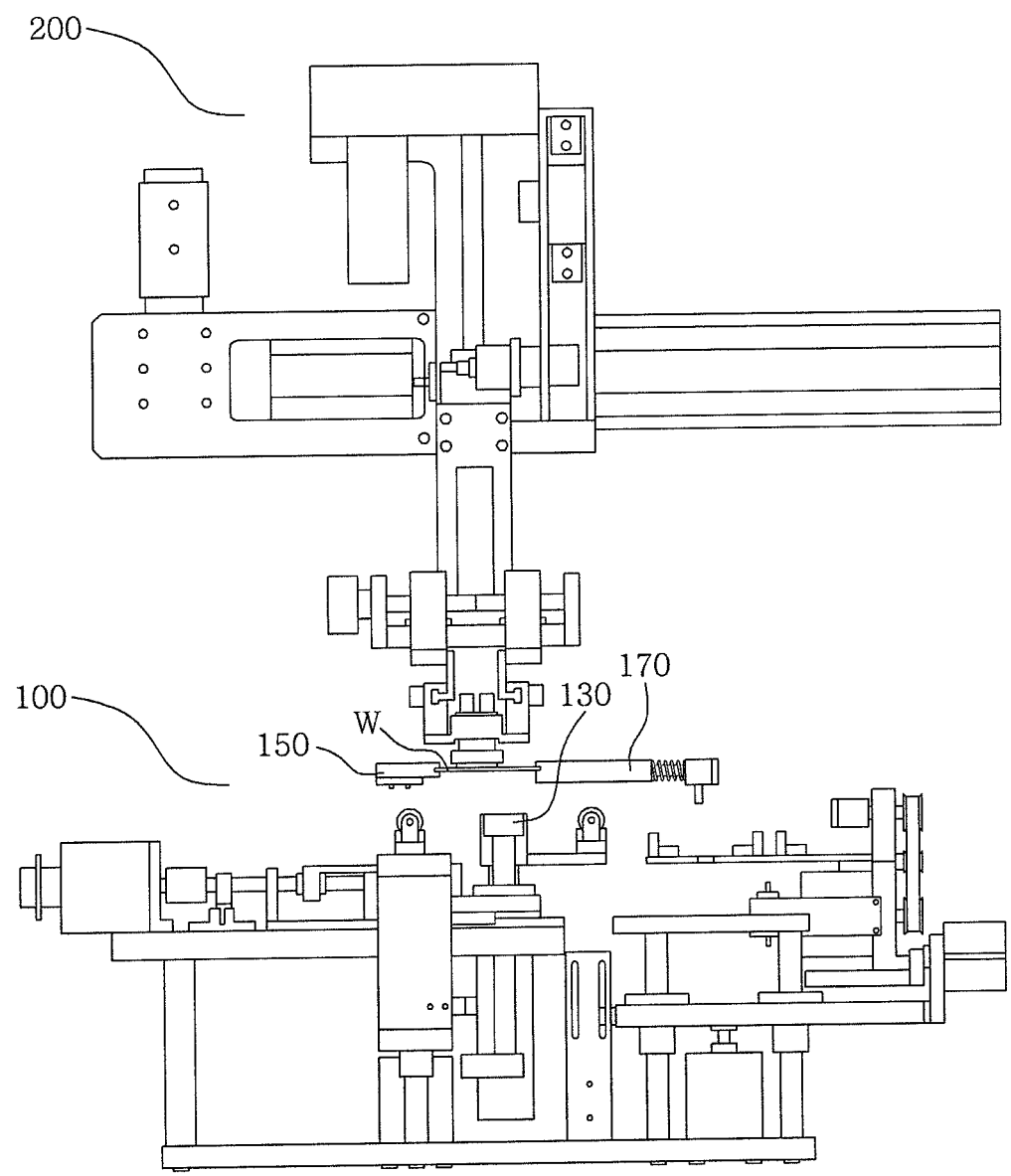

Referring to FIG. 3D, the support plate 130 moves down. Subsequently, the movable gripper 170 moves forward and grips the semiconductor substrate W.

Figure 3E:
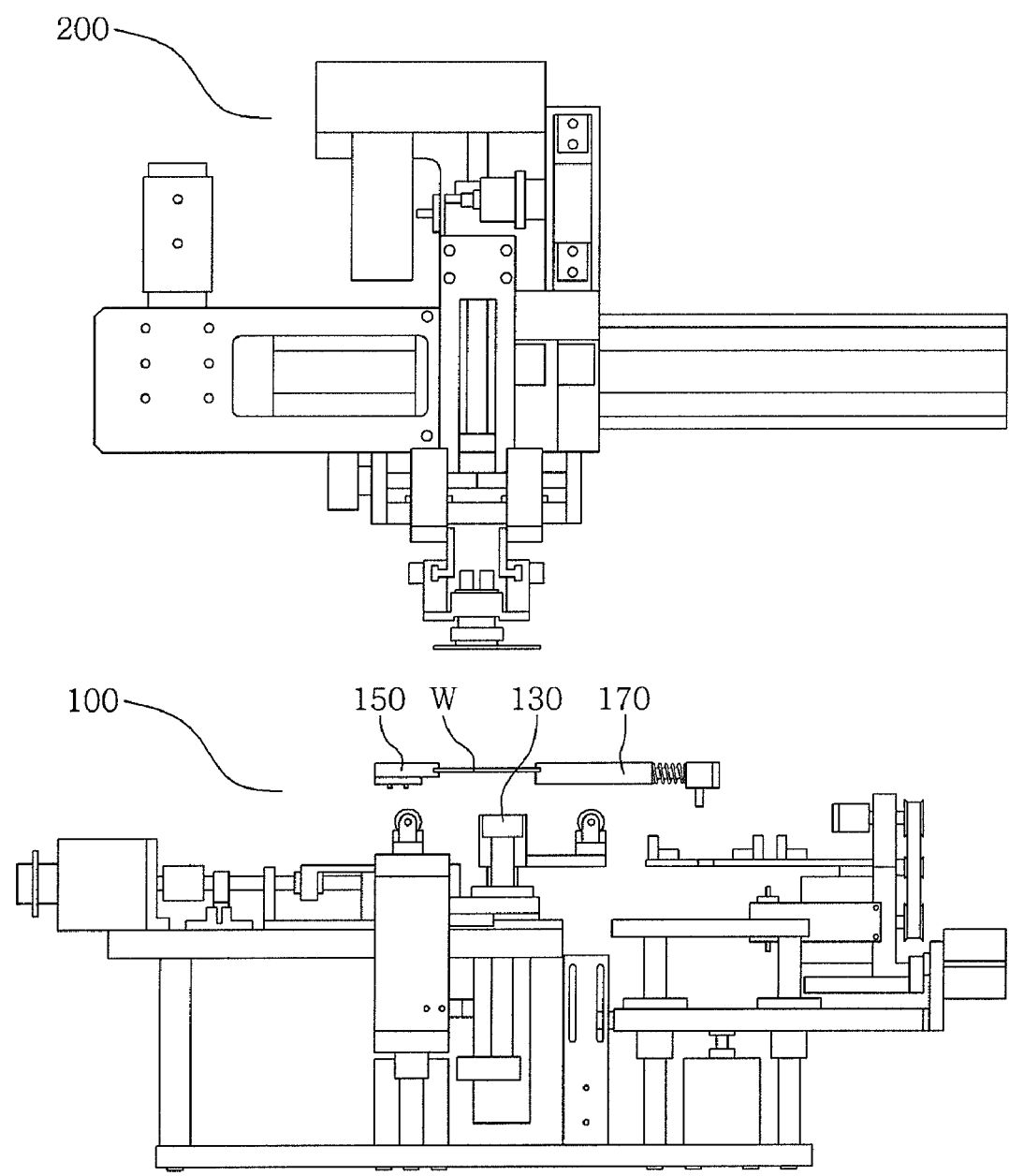

Referring to FIG. 3E, the pick-up arm 200 rises and moves to a position to pick up another substrate W. Here, the clamp 100 also moves and another clamp 100 comes into the position.

As described above, a clamping apparatus including a clamp according to the example embodiments is capable of clamping various semiconductor substrates so that semiconductor device fabrication processes may be performed without interruption.

Names and functions, etc. of elements not denoted by reference numerals in drawings can be readily understood from the detailed description of the example embodiments.

Having described the example embodiments of the inventive concept, it is further noted that it is readily apparent to those of reasonable skill in the art that various modifications may be made without departing from the spirit and scope of the invention which is defined by the metes and bounds of the appended claims.

What is claimed is:

1. A semiconductor device fabrication process using a clamping apparatus including a main body, a support plate partially coupled to the main body and wherein the support plate is movable vertically, a fixed gripper coupled and fixed onto the main body, and a movable gripper disposed on the main body, wherein the main body is disk-shaped and rotates on its center axis, and wherein the main body comprises a space through which the support plate passes vertically and wherein the movable gripper is movable horizontally, the process comprising:

picking up a semiconductor substrate;
moving the semiconductor substrate to the clamping apparatus using a pick-up arm;
raising the support plate above the main body;
placing the semiconductor substrate down on the support plate using the pick-up arm;
lowering the support plate;
moving the movable gripper horizontally to clamp the semiconductor substrate on the support plate; and
raising the pick-up arm.

2. The semiconductor device fabrication process according to claim 1, wherein a surface of the support plate is disposed below the main body.

3. The semiconductor device fabrication process according to claim 1, further comprising a rail formed on the main body, and wherein the movable gripper moves horizontally on the rail.

4. A semiconductor device fabrication process using a clamping apparatus including a main body, a support plate partially coupled to the main body and wherein the support plate is movable vertically, a fixed gripper coupled and fixed onto the main body, a movable gripper disposed on the main body, and a first buffering unit formed between the first plate unit and the vertical driving unit, wherein the first plate unit is rectangular, wherein the support plate is partially coupled to the main body by a first fixing unit, and wherein the support plate comprises a first plate unit having a flat shape and a vertical driving unit coupled to the bottom of the first plate unit and wherein the vertical driving unit moves the first plate unit vertically and wherein the movable gripper is movable horizontally, the process comprising:

picking up a semiconductor substrate;
moving the semiconductor substrate to the clamping apparatus using a pick-up arm;
raising the support plate above the main body;
placing the semiconductor substrate down on the support plate using the pick-up arm;
lowering the support plate;
moving the movable gripper horizontally to clamp the semiconductor substrate on the support plate; and
raising the pick-up arm.

5. The semiconductor device fabrication process according to claim 4, further comprising a first buffering member formed on the first plate unit.

6. A semiconductor device fabrication process using a clamping apparatus including a main body, a support plate partially coupled to the main body and wherein the support plate is movable vertically, a fixed gripper coupled and fixed onto the main body, and a movable gripper disposed on the main body, and wherein the support plate is partially coupled to the main body by a first fixing unit, and wherein the support plate comprises a first plate unit having a flat shape and a vertical driving unit coupled to the bottom of the first plate unit and wherein the vertical driving unit moves the first plate unit vertically, wherein the fixed gripper comprises: a second plate unit; and a second fixing unit coupled to the main body and wherein the movable gripper is movable horizontally, the process comprising:

picking up a semiconductor substrate;
moving the semiconductor substrate to the clamping apparatus using a pick-up arm;
raising the support plate above the main body;
placing the semiconductor substrate down on the support plate using the pick-up arm;

lowering the support plate;

moving the movable gripper horizontally to clamp the semiconductor substrate on the support plate; and raising the pick-up arm.

7. The semiconductor device fabrication process according to claim 6, further comprising a second buffering unit formed between the second plate unit and the second fixing unit, wherein the second plate unit is bar-shaped.

8. The semiconductor device fabrication process according to claim 6, further comprising a second buffering member formed on one surface of the second plate unit.

9. The semiconductor device fabrication process according to claim 8, wherein the second fixing unit is disposed at two or more positions and the second buffering unit is disposed at three or more positions.

10. The semiconductor device fabrication process according to claim 6, wherein the movable gripper comprises a third plate unit and a forward/backward driving unit configured to move the third plate unit horizontally.

11. The semiconductor device fabrication process according to claim 10, further comprising a third buffering unit formed between the third plate unit and the forward/backward driving unit, wherein the third plate unit is bar-shaped.

12. The semiconductor device fabrication process according to claim 10, further comprising a driving shaft configured to transfer a driving force of the forward/backward driving unit to the third plate unit.

13. The semiconductor device fabrication process according to claim 12, wherein the forward/backward driving unit operates by a rotational force from a driving motor, and the driving shaft is coupled to a screw-shaped groove formed in a part of the movable gripper.

14. The semiconductor device fabrication process according to claim 10, further comprising a third buffering member formed on one surface of the third plate unit.

15. The semiconductor device fabrication process according to claim 10, wherein the third plate unit comprises a substrate supporting unit shaped as steps.

16. The semiconductor device fabrication process according to claim 15, wherein the substrate supporting unit comprises a flat substrate supporting surface and an oblique side surface.

17. The semiconductor device fabrication process according to claim 16, wherein ends of the substrate supporting surface have a round shape.

18. The semiconductor device fabrication process according to claim 15, wherein the substrate supporting unit has a horizontally recessed shape.

* * * * *